US006850623B1

(12) United States Patent
Norris et al.

(10) Patent No.: US 6,850,623 B1
(45) Date of Patent: Feb. 1, 2005

(54) PARAMETRIC LOUDSPEAKER WITH IMPROVED PHASE CHARACTERISTICS

(75) Inventors: Elwood G. Norris, Poway, CA (US); Joseph O. Norris, Ramona, CA (US); James J. Croft, III, Poway, CA (US)

(73) Assignee: American Technology Corporation, San Diego, CA (US)

( * ) Notice: Subject to any disclaimer, the term of this patent is extended or adjusted under 35 U.S.C. 154(b) by 0 days.

(21) Appl. No.: 09/430,801

(22) Filed: Oct. 29, 1999

(51) Int. Cl.[7] .......................... H03G 1/00; H04R 1/02; G08C 19/16; G08B 1/00

(52) U.S. Cl. .......................... 381/97; 381/89; 181/142; 340/870.25; 340/870.26

(58) Field of Search .......................... 381/97, 77, 89; 310/316.02; 318/116

(56) References Cited

U.S. PATENT DOCUMENTS

| | | | | |
|---|---|---|---|---|
| 1,951,669 A | * | 3/1934 | Ramsey | 367/137 |
| 4,015,089 A | * | 3/1977 | Ishii et al. | 381/89 |
| 4,823,908 A | | 4/1989 | Tanaka et al. | |
| 5,767,609 A | * | 6/1998 | Suganuma | 310/316.02 |
| 5,892,315 A | | 4/1999 | Gipson et al. | |
| 6,044,160 A | | 3/2000 | Norris | |
| 6,556,687 B1 | * | 4/2003 | Manabe | 381/387 |

FOREIGN PATENT DOCUMENTS

| | | | | |
|---|---|---|---|---|
| JP | 60021695 A | * | 2/1985 | H04R/3/00 |

OTHER PUBLICATIONS

The audio spotlight: An application of noninear interaction of sound waves to a new type of loudspeaker design by Masahide Yoneyama and Jun–Ichiroh Fujimoto, J. Acoust. Soc.Am. 73 (5), May 1963, pp. 1532–1536.

* cited by examiner

*Primary Examiner*—Xu Mei
*Assistant Examiner*—Andrew Graham
(74) *Attorney, Agent, or Firm*—Thope North & Western LLP

(57) ABSTRACT

A parametric loudspeaker which uses multiple piezoelectric bimorph transducers. These multiple piezoelectric bimorphs have a resonant frequency which varies from unit to unit. The phase response at and near the resonant frequency changes at a very high rate with slight changes in frequency. The associated modulator electronics have a primary carrier frequency that is optimized for maximum parametric output. This is achieved by aligning the carrier frequency with the flattest portions of the phase curve for maximum phase coordination among the multiple devices.

34 Claims, 5 Drawing Sheets

| Number of Transducers | Transducer Type | Ultrasonic dB | Parametric dB |
|---|---|---|---|
| 1 | single | 120 dB | 50 dB |
| 100 | unphased | 134 dB | 78 dB |
| 100 | phased | 139 dB | 88 dB |
| 100 | ideal | 140 dB | 90 dB |

Fig. 3

PARAMETRIC LOUDSPEAKER WITH IMPROVED PHASE CHARACTERISTICS

TECHNICAL FIELD

This invention relates generally to the field of parametric loudspeakers. More particularly, this invention relates to phase correction and alignment techniques to compensate for the phase errors of transducers in a parametric loudspeaker.

BACKGROUND ART

A parametric loudspeaker is a sound emission system that directly generates ultrasonic frequencies into a medium such as air. The parametric array in air results from the introduction of sufficiently intense, audio modulated ultrasonic signals into an air column. Self demodulation, or down-conversion, occurs along the air column resulting in an audible acoustic signal. This process occurs because of the known physical principle that when two sound waves with different frequencies are radiated simultaneously in the same medium, a sound wave having a wave form including the sum and difference of the two frequencies is produced by the non-linear interaction (parametric interaction) of the two sound waves.

For example, if the two original sound waves are ultrasonic waves and the difference between them is selected to be an audio frequency, an audible sound is generated by the parametric interaction. The result is a highly directional loudspeaker that is effectively a virtual end fired array. Historically these devices have not been able to achieve high performance for multiple reasons, much of which can be attributed to transducer performance. In the prior art, devices are disclosed that use piezoelectric bimorph devices which are also known as piezoelectric benders. The prior art systems have used clusters of piezoelectric bimorphs that number anywhere from 500 to over 1400 bimorph units. The large number of bimorphs is due to the very high ultrasonic outputs required for a parametric loudspeaker. The output performance from these bimorph devices has not been adequate in prior art systems.

An example of the prior art is described in the article, "*The audio spotlight: An application of nonlinear interaction of sound waves to a new type of loudspeaker design.*", by Yoneyama and Fujimoto in the *Journal of the Acoustical Society of America,* Volume 73, 1983, which is incorporated herein by reference. Their use of an array of 547 piezo bimorph type transducers typifies previous and subsequent prior art parametric loudspeakers.

As with other prior art parametric loudspeakers, Yoneyama teaches placing the primary carrier frequency or carrier signal at the transducer's resonance frequency which is the frequency of maximum amplitude for a single transducer. This is the region of highest amplitude and has been presumed to provide the best performance for an array of transducers. Further, Yoneyama also teaches the mounting of the multiple transducers all in the same plane. However, it is believed that such prior art arrays all suffered from the disproportionate loss of sound pressure hi level (SPL) with increasing numbers of transducers Accordingly, it would be an improvement over the state of the art to provide a new apparatus and method for a parametric loudspeaker that uses multiple transducer devices and operates with improved phase matching and provides increased output.

OBJECTS AND SUMMARY OF THE INVENTION

It is an object of the present invention to provide a parametric loudspeaker that uses multiple transducer devices and operates with improved phase matching.

It is an object of the present invention to provide a parametric loudspeaker with multiple transducer devices that operates with improved parametric conversion efficiency.

It is a further object of the present invention to provide a parametric loudspeaker that uses multiple transducer devices and reduces the ultrasonic power required.

It is yet another object of the present invention to provide a parametric loudspeaker that uses multiple transducer devices and has increased directivity.

The presently preferred embodiment of the invention is a parametric loudspeaker system with an electronic modulator adapted to receive audio signals. The electronic modulator also generates a carrier frequency to be modulated with the audio signals to produce a modulated signal. The parametric loud speaker system also has at least one ultrasonic transducer, coupled to the electronic modulator to reproduce the modulated signal. A plurality of transducers are coupled to the modulator, and the transducers are positioned and controlled to carefully maximize phase coherence and matching. Misalignment and mismatching of transducers is purposely corrected to reduce phase cancellation of the output in both the ultrasonic and audio stages of the output.

In one preferred embodiment of the invention, the ultrasonic transducers have a resonant frequency and the carrier frequency is purposefully offset from the resonant frequency, which surprisingly increases the parametric output and avoids phase cancellation.

An alternative embodiment of the invention is a parametric loudspeaker system mounted on a non-planar base or curved plate. An array of at least two piezoelectric bimorph transducers are mounted on the non-planar base. The at least two piezoelectric bimorph transducers are individually aligned substantially equidistant to a point located both forward from the base and centered with the non-planar base. This allows the output from each transducer to remain in phase.

Another embodiment of the invention is a method for increasing the parametric output of a parametric loudspeaker system. The first step is generating a carrier frequency in an electronic modulator. Then at least one ultrasonic transducer is connected to the electronic modulator. The ultrasonic modulator also has a resonant frequency. Another step is purposefully offsetting the carrier frequency from the resonant frequency. After this the carrier frequency is modulated with audio signals received into the electronic modulator, to produce a modulated signal. Finally, the modulated signal is reproduced using the offset carrier frequency to increase the parametric output.

These and other objects, features, advantages and alternative aspects of the present invention will become apparent to those skilled in the art from a consideration of the following detailed description taken in combination with the accompanying drawings.

BRIEF DESCRIPTION OF THE DRAWINGS

FIG. 3 shows the parametric output of the present invention versus the prior art;

DISCLOSURE OF THE INVENTION

Reference will now be made to the drawings in which the various elements of the present invention will be given numerical designations and in which the invention will be discussed so as to enable one skilled in the art to make and use the invention. It is to be understood that the following description is only exemplary of certain embodiments of the present invention, and should not be viewed as narrowing the claims which follow.

Figure 1:
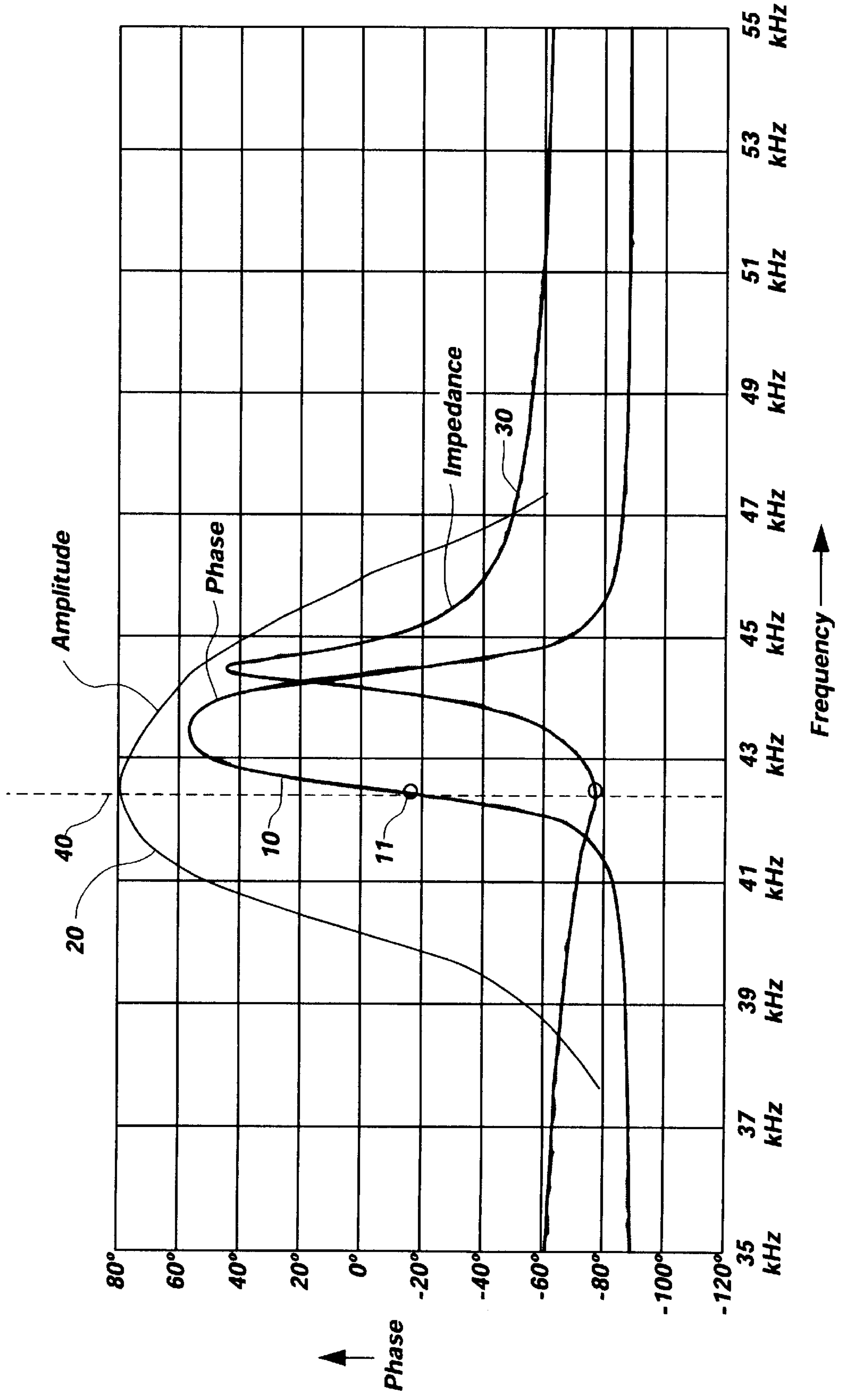
FIG. 1 shows the impedance, phase, and amplitude curves for a typical bimorph transducer with a conventional carrier frequency point.

FIG. 1 shows the performance curves for a selected piezoelectric bimorph used for a parametric loudspeaker. The phase response is represented by curve 10. The amplitude curve 20, and the impedance curve 30 are also shown. At the peak 40 of the amplitude curve 20 is the resonant frequency of the device. This is the preferred point for the carrier frequency as taught in the prior art. In conventional parametric speaker design, it is most important to have the maximum carrier output because this in turn generates the maximum audio output. To produce the maximum carrier output, the transducer's maximum resonance amplitude has conventionally been used as the carrier frequency. Accordingly, conventional design research has not looked at the phase variance of transducers as compared to a transducer's resonant frequency. Point 11 on the phase curve 10 is also at the resonant frequency which is the same frequency as the maximum amplitude 40. As can be seen, phase point 11 is at the steepest phase transition point on the phase curve 10. This is not a problem when using a single device.

In contrast, multiple transducer devices are most often required by a parametric loudspeaker to generate sufficient volume. When multiple transducers are used, these steep phase transitions can cause dramatic phase differences between any two transducers (especially bimorphs) operating at the same frequency. The output performance from these multiple devices has not been adequate in prior art systems. This is due to phase matching errors caused by variations from device to device.

In a bimorph device, each individual device has significant acoustic output. Even though using multiple bimorph devices appears to be a good choice for a parametric transducer, the phase relationships of these separate bimorph devices are such that the total output of many of these devices used as a cluster do not add up to the amount predicted by the theoretical summing of all the devices. This phase loss and lack of phase matching reduces the potential output that is predicted by theoretically summing the output of all the individual devices. These same phase errors can also cause unintentional beam steering which further reduces output and directivity.

Figure 2:
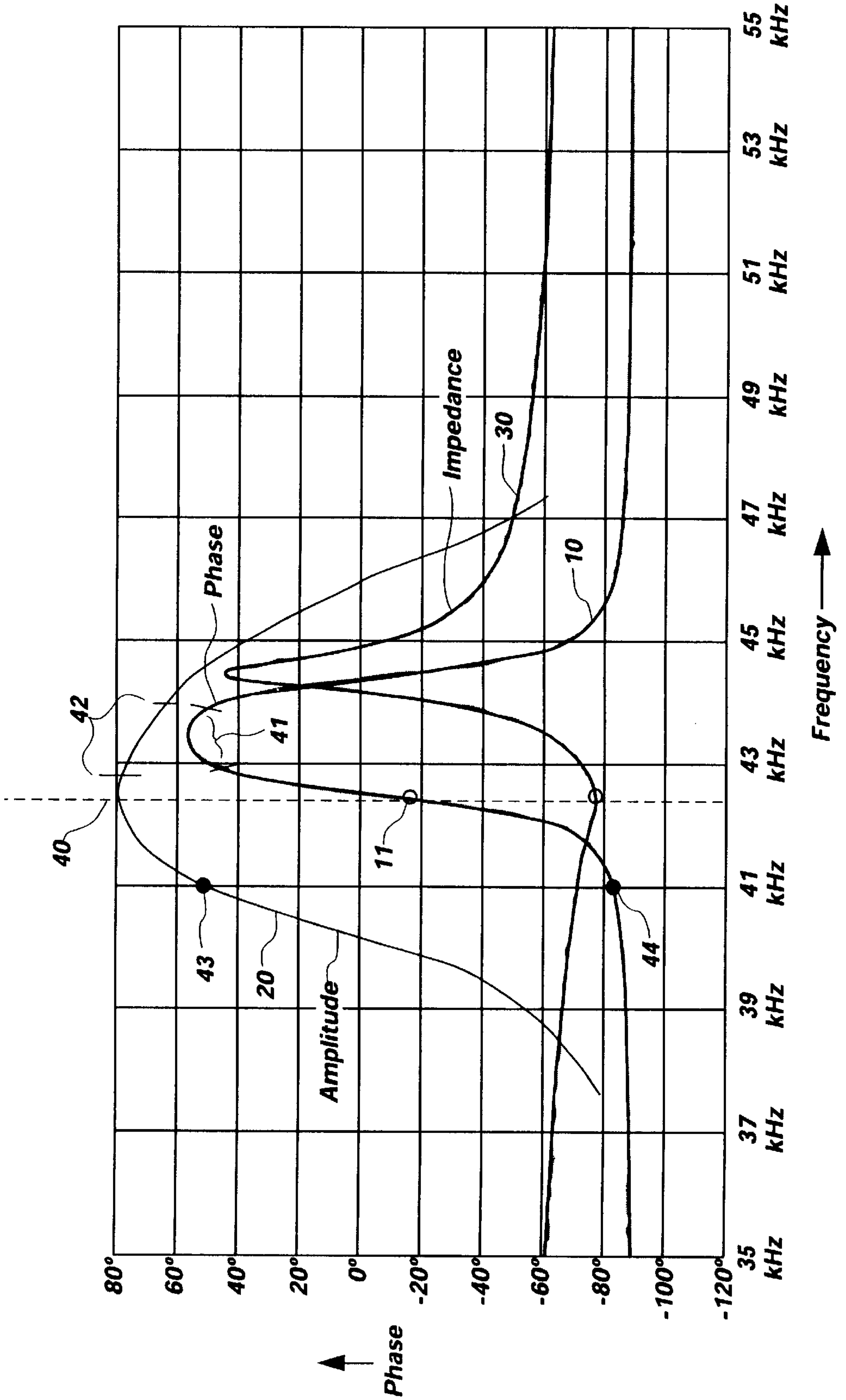
FIG. 2 shows the improved carrier frequency points of the current invention.

FIG. 2 shows performance curves for a piezoelectric bimorph used in a parametric loudspeaker. The phase response is represented by curve 10. The amplitude curve 20, and the impedance curve 30 are also shown. At the peak 40 of the amplitude curve 20 is the resonant frequency of the device. Again, this is the carrier frequency of preference as taught in the prior art, and this maximum amplitude resonance is used as the carrier frequency. Point 11 on phase curve 10 is also at the resonant frequency which is the same frequency as maximum amplitude 40. As can be seen, phase point 11 is at the steepest phase transition point on phase curve 10. This is not a problem when using a single device because there is only one device and so no phase problems are introduced. Of course, the use of multiple devices is most often required by a parametric loudspeaker to produce acceptable volumes. Accordingly, these steep phase transitions cause dramatic phase differences between any two bimorphs which have the slightest variation in frequency. Each bimorph or transducer device will have slight variations from manufacturing conditions, material variations, minor defects, and other uncontrollable variables. Even two bimorphs which are engineered to be tuned to the same frequency, will actually have some variation in the actual frequency they produce. These variations are exaggerated when the carrier frequency is set at the amplitude maximum 20, because of the carrier frequency's relationship to the transducer's phase 10. In other words, a small frequency variation in the bimorph produces a large phase change when the carrier frequency (or carrier signal) is set at the amplitude maximum.

The current invention moves the carrier frequency to the lower amplitude area 42 where the corresponding phase response area of the curve 41 is quite flat as compared to point 11. The carrier frequency change reduces the significant phase differences between devices operating at essentially the same frequency. This phase selection is effective for increasing the maximum audio output as long as the carrier frequency is set within the approximate range of the window 42. The preferred range for the window is determined by adding 1% to 5% of the maximum resonant frequency 40 to that maximum frequency. It should be noted that the window for the carrier frequency could be greater than 5%, but if the window becomes too large then the carrier frequency setting will have the same problems because it will enter the area of rapid phase change. The frequency amount that is preferred to be added to the carrier frequency will be between approximately 400 Hertz to 2000 Hertz. The offset could be greater than 2000 Hertz, if the point at which the carrier frequency is set has a low rate of phase change. The preferred phase change would be less than 20 degrees for 2½ percent of change in the frequency. While this is the preferred range, a workable amount of phase shift would be a shift of between 10 to 40 degrees for each 2½ percent change in the frequency.

Moving the carrier frequency to a frequency which produces a lower amplitude is a surprising change because it means that the carrier frequency is not at maximum output. It is very important to note that this adjustment to the carrier frequency actually reduces the maximum output of the individual transducers. So, it is actually counterintuitive to reduce the carrier frequency because the overall output is anticipated to be worse. What actually happens is the opposite. The overall output of the group of transducers is increased. This is surprising because although the output from the carrier frequency has been reduced, the output from the collective piezoelectric transducers increases. The reason for this advantage is the relative phase coherence of the transducers has been substantially increased.

This system of moving the carrier frequency as described above is also effectively used with double sideband signals and similar well known signal configurations. An alternative embodiment of the speaker uses a single sideband signal or a truncated double sideband signal. When a single sideband signal is used, the carrier frequency can be set to operate on the lower frequency side of the amplitude curve 20. For a single sideband signal, the carrier frequency can be set at approximately point 43 which corresponds to point 44 on phase curve 10. The advantage of setting the carrier frequency at approximately point 43 is that it corresponds to an area of the phase curve 10 which has a lower rate of change. It can be seen that the phase curve 10 is flatter in the area of point 44, which is similar to the window area 42. A window of optimum phase response and output can also be setup around point 43 which would have a similar but slightly smaller width than the window 42. In this case, a window is determined around point 43 by subtracting 3%–5% of the maximum resonant frequency 40 from the maximum resonant frequency.

To better understand how the optimized phase is related to the parametric loudspeaker system, the use of the phase shifted carrier frequency will now be described. The first step in using a phase shifted carrier frequency is generating a carrier frequency in an electronic modulator. This carrier signal will be an ultrasonic carrier frequency well above the audible range of 20 kHz and is preferably around 35–45 kHz. Then at least one ultrasonic transducer is connected to the electronic modulator. The ultrasonic transducer also has a resonant frequency. Another step is offsetting the carrier frequency from the resonant frequency. The carrier frequency will be offset by about 1% to 5% which moves it into the area of reduced phase changes. After this the carrier frequency is modulated with audio signals received into the electronic modulator, to produce a modulated signal. Finally, the modulated signal is reproduced using the offset carrier frequency to increase the parametric output.

FIG. 3 shows a table comparing the parametric output of bimorphs which are conventionally phased and bimorphs which have improved phase characteristics. The first line of the table depicts a single piezoelectric bimorph which delivers 120 dB of ultrasonic output and 50 dB of parametric output. The parametric output is the audible sound which is generated by parametric interaction. Because of the phase problems stated above, the expected cumulative performance does not translate proportionally to multiple devices because each device may have a slightly different resonant frequency. The fourth line in the table shows that the theoretical ideal summed output of 100 of the same devices is shown to be 140 dB of ultrasonic output and 90 dB of parametric output. The second entry in the table shows that a transducer array, which does not use phase optimization, delivers 134 dB of ultrasonic output and 78 dB of parametric output. This is a 6 dB and a 12 dB loss compared to the theoretical output for 100 devices.

Line 3 of the table shows 100 transducers which use the optimized phase configuration of the present invention. A phase optimized system with the current invention's techniques delivers 139 dB of ultrasonic output and 88 dB of parametric output. This is a significant improvement over the prior art and approaches the theoretical lossless ideal.

Figure 4A:
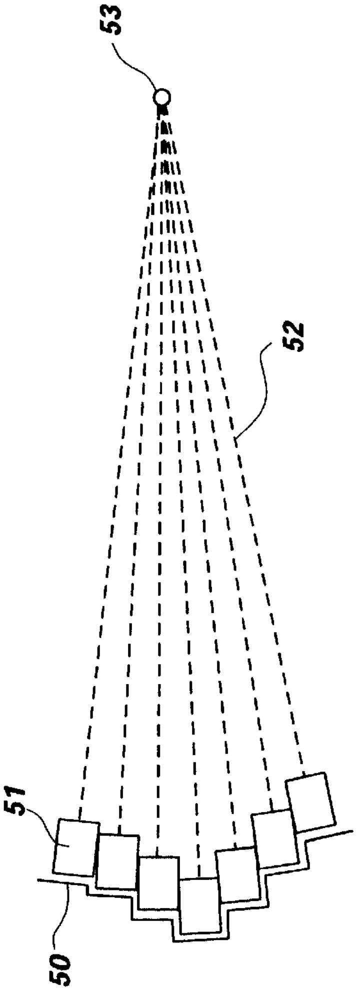
FIG. 4*a* shows an improved alignment for multiple transducers using a step configuration.

Transducers used for a parametric speaker may also be optimized to reduce the phase shift between separate devices by using an optimal physical arrangement. An effective arrangement is to arrange the transducers in a somewhat curved arrangement so that the output from each transducer is directed to the same spatial point. FIG. 4*a* shows a side view of an emitter constructed such that the individual transducers 51 are mounted on stepped plate 50. The transducers face substantially forward with all faces substantially directed toward a common predetermined point 53 to provide equal length paths 52 to the point 53. Because the length of the paths will be equal, each of the audible wave fronts which reach the point will have the same phase. In contrast, when a group of emitters is mounted on a planar surface some emitters have a longer distance to travel to an individual point. Differences in distance will cause the waves to be phase shifted or out of phase. This is especially noticeable with an ultrasonic system because the original wavelengths are relatively short when compared to a conventional audio system. If the difference in distances is great enough, the wavelengths can actually cancel themselves out and produce a lesser output. Another problem which exists if the transducers are different distances from the target point is that the phase shifting may cause beam steering which will be heard by a listener. It should also be apparent from this disclosure that some other mounting means could be used to configure the transducers and avoid phase shift distortion. For example, the bimorph transducers could be affixed together with an adhesive in a non-planar manner or attached to a pronged device with a different prong length for each transducer.

Figure 4B:
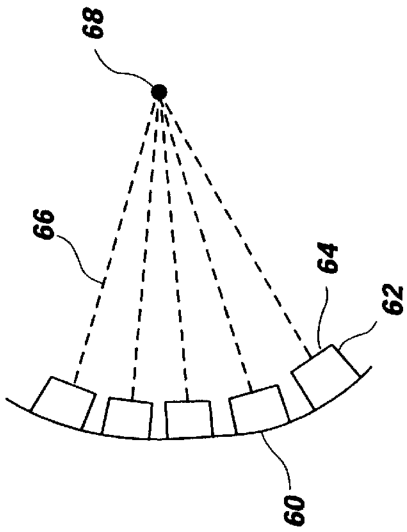
FIG. 4*b* shows an improved alignment for multiple transducers using a curve.
Figure 4C:
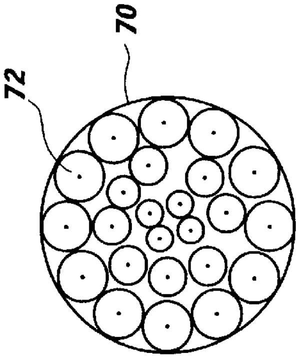
FIG. 4*c* shows a frontal view of FIGS. 4*a* and 4*b;*

FIG. 4*b* shows a side view of an emitter constructed with the individual transducers 62 mounted on a curved concave plate 60 or base and facing substantially inward with all of the faces 64 angled to provide equal length paths 66 to a predetermined distance point 68. It should also be realized that a convex plate can be used to disperse the parametric output. FIG. 4*c* is a frontal view of FIGS. 4*a* and 4*b* showing the individual transducers 72 mounted on back plate 70. The predetermined distance point 68 should be far enough away from the transducers to allow for the parametric interaction to take place. The minimum effective distance that the emitters should be focused for is 0.33 meters. It is preferred that the distance point 68 be between 0.33 meters and 3 meters from the emitters. This is because a person listening to the speakers will be at approximately 0.33 meters to 3 meters. Of course, the distance used could also be slightly less or somewhat greater.

Figure 5B:
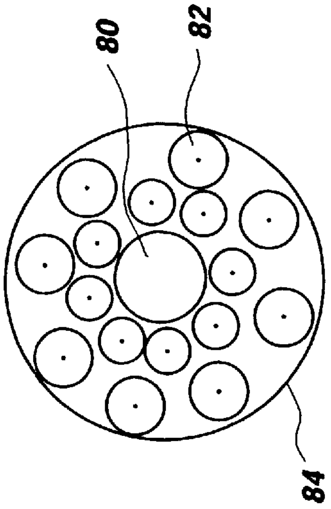
FIG. 5*b* shows a frontal view of FIG. 5*a*.
Figure 5A:
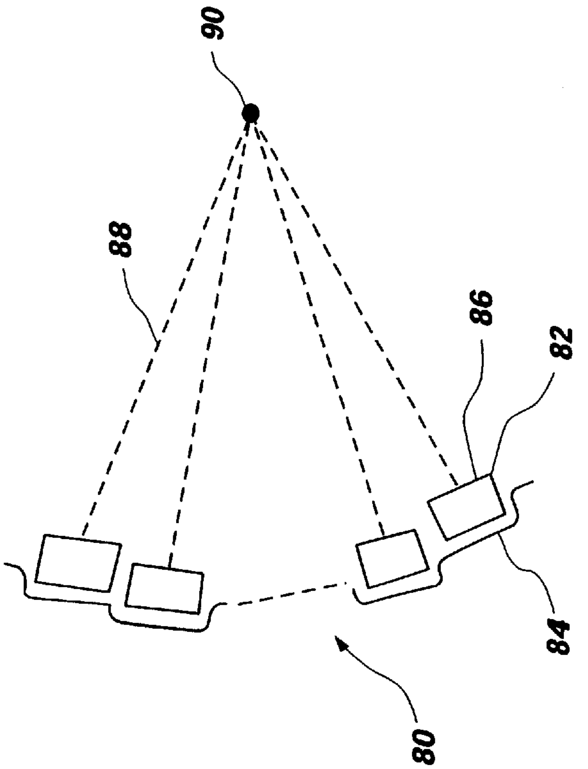
FIG. 5*a* shows the improved alignment of multiple transducers with a step configuration and an open center.

FIG. 5*a* has a similar construction to FIG. 4*a* but with an open section in the middle 80 allowing the multiple transducers 82 to form an open ring. The individual transducers 82 are mounted on stepped plate 84 and face substantially forward with all faces 86 substantially parallel to provide equal length paths 88 to a predetermined spatial point 90. FIG. 5*b* is a frontal view of the device in FIG. 5*a* showing individual transducers 82 mounted on back plate 84 with an open center 80 allowing the transducer to form an open ring structure. This configuration has the same advantage as FIGS. 4*a*–4*c* because it creates equal path lengths to a point. Another distinct advantage of the configuration shown in FIG. 5*a* is that it can produce 80% to 90% as much output as a speaker which has an active center area. The configuration shown in FIG. 5*a* can have 40 to 50% fewer bimorph transducers as compared to a ring with an active center area, but there is with only a 10% to 20% decrease in output. The actual output depends on the size of the ring and size of the open center portion.

This invention has been described above with regard to piezoelectric bimorph transducer elements. The elements of the invention above could also be applied to other parametric transducer devices such as piezoelectric film. The shifting of the carrier frequency will be advantageous to any parametric transducer device which has phase characteristics with a high rate of change at the transducer's resonant frequency.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A parametric loudspeaker system, comprising:

an electronic modulator, adapted to receive audio signals, wherein the electronic modulator generates a carrier frequency to be modulated with the audio signals to produce a modulated signal;

at least two ultrasonic transducers, coupled to the electronic modulator to reproduce the modulated signal, the at least two ultrasonic transducers each having at least one resonant frequency, wherein the carrier frequency is offset from each at least one resonant frequency in view of the rate of change of phase of each transducer in the vicinity of each at least one resonant frequency in order to increase the phase coherence and combined parametric output of said transducers.

2. The parametric loudspeaker system as defined in claim 1 wherein the carrier frequency is placed at a frequency that is divergent from the resonant frequency of the transducer by at least 1%.

3. The parametric loudspeaker system as defined in claim 1 wherein the carrier frequency is placed at a frequency that is divergent from the resonant frequency of the transducer by 1% to 3%.

4. The parametric loudspeaker system as defined in claim 1 wherein the carrier frequency is placed at a frequency that is divergent from the resonant frequency of the transducer by 2% to 4%.

5. The parametric loudspeaker system as defined in claim 1 wherein the carrier frequency is placed at a frequency that is divergent from the resonant frequency of the transducer by up to 5%.

6. The parametric loudspeaker system as defined in claim 1 wherein the carrier frequency is placed at a frequency that is divergent from the resonant frequency of the transducer by at least 400 Hertz.

7. The parametric loudspeaker system as defined in claim 1 wherein the carrier frequency is placed at a frequency that is divergent from the resonant frequency of the transducer by up to 2000 Hertz.

8. The parametric loudspeaker system as defined in claim 1 wherein the carrier frequency is placed at a frequency that is divergent from the resonant frequency of the transducer by 400 to 2000 Hertz.

9. The parametric loudspeaker system as defined in claim 1 wherein the carrier frequency is placed at a frequency where a rate of phase change for a bimorph transducer is less than 40 degrees phase shift for each 2½ percent shift in frequency.

10. The parametric loudspeaker system as defined in claim 1 wherein the carrier frequency is placed at a frequency where a rate of phase change for a bimorph transducer is less than 20 degrees phase shift for each 2½ percent shift in frequency.

11. The parametric loudspeaker system as defined in claim 1 wherein the carrier frequency is placed at a frequency where a rate of phase change for a bimorph transducer is between 10 to 40 degrees phase shift for each 2½ percent shift in frequency.

12. The parametric loudspeaker system as defined in claim 1 wherein the carrier frequency is placed at a frequency where a rate of phase change for a transducer is less than 40 degrees phase shift for each 2½ percent shift in frequency.

13. The parametric loudspeaker system as defined in claim 1 wherein the carrier frequency is placed at a frequency where a rate of phase change for a transducer is less than 20 degrees phase shift for each 2½ percent shift in frequency.

14. The parametric loudspeaker system as defined in claim 1 wherein the carrier frequency is placed at a frequency where a rate of phase change for a transducer is between 10 to 40 degrees phase shift for each 2½ percent shift in frequency.

15. The parametric loudspeaker system as in claim 1 wherein the at least one ultrasonic transducer further comprises:

(a) a non-planar base; and (b) at least two piezoelectric bimorph transducers mounted on the non-planar base, wherein the at least two piezoelectric bimorph transducers are individually aligned substantially equidistant to a point located both forward from and centered on the non-planar base.

16. The parametric loudspeaker system as in claim 15 wherein the point located both forward from and centered on the non-planar base is at a distance of greater than 0.33 meters.

17. The parametric loudspeaker system as in claim 15 wherein the point located both forward from and centered on the non-planar base is at a distance of less than 3.0 meters.

18. The parametric loudspeaker system as in claim 15 wherein the point located both forward from and centered on the non-planar base is at a distance between 0.33 to 3.0 meters.

19. The parametric loudspeaker system as in claim 1, wherein the at least one ultrasonic transducer further comprises:

a non-planar base; and an array of parametric sound emission areas mounted on the non-planar base, wherein the array of sound emission areas are individually aligned substantially equidistant to a point located both forward from and centered on the array of sound emission areas.

20. The parametric loudspeaker system as in claim 19 wherein the point located both forward from and centered on the array of sound emission areas is at a distance of greater than 0.33 meters.

21. The parametric loudspeaker system as in claim 19 wherein the point located both forward from and centered on the array of sound emission areas is at a distance of greater than 1.0 meters.

22. The parametric loudspeaker system as in claim 19 wherein the point located both forward from and centered on the array of sound emission areas is at a distance of greater than 3.0 meters.

23. The parametric loudspeaker system as in claim 19 wherein the point located both forward from and centered on the array of sound emission areas is at a distance between 0.33 to 3.0 meters.

24. The parametric loudspeaker system as in claim 1 wherein the at least one ultrasonic transducer further comprises:

(a) a point located both forward from and centered on the parametric loudspeaker system; and (b) at least two piezoelectric bimorph transducers configured in a non-planar fashion, wherein the at least two piezoelectric bimorph transducers are individually aligned substantially equidistant from the point to avoid phase distortions in the transducer output.

25. The parametric loudspeaker system as in claim 24 wherein the point located both forward from and centered on the non-planar base is at a distance between 0.33 to 3.0 meters.

26. The parametric loudspeaker system as in claim 24 further comprising a non-planar mounting means to mount the at least two piezoelectric bimorph speakers.

27. A method for increasing the parametric output of a parametric loudspeaker system, comprising the steps of:

(a) providing multiple parametric emitters that output signals in a frequency band;

(b) correlating and controlling the phase relationships to increase phase coherence between each parametric emitter to maximize parametric output, wherein said controlling and correlating includes offsetting a carrier frequency applied to each emitter from a resonant frequency of each emitter in view of a rate of change of phase of each emitter in the vicinity of each resonant frequency; and (c) emitting ultrasonic energy from the parametric emitters, wherein the correlated phase relationship increases the parametric output.

28. A method for increasing the parametric output of a parametric loudspeaker system, comprising the steps of:

(a) generating a carrier frequency in an electronic modulator;

(b) providing at least two ultrasonic emitters connected to the electronic modulator, wherein the ultrasonic transducers each have a resonant frequency;

(c) offsetting the carrier frequency from each resonant frequency in view of the rate of change of phase of each emitter in the vicinity of said resonant frequency;

(d) modulating the carrier frequency with audio signals received into the electronic modulator, to produce a modulated signal;

(e) reproducing the modulated signal using the offset carrier frequency to increase the combined parametric output of the emitters.

29. The method as in claim 28 wherein step (c) further comprises the step of offsetting the carrier frequency from the resonant frequency by at least 1%.

30. The method as in claim 28 wherein step (c) further comprises the step of offsetting the carrier frequency from the resonant frequency by up to 5%.

31. The method as in claim 28 wherein step (c) further comprises the step of offsetting the carrier frequency from the resonant frequency by 2 to 4%.

32. The method as in claim 28 wherein step (c) further comprises the step of offsetting the carrier frequency from the resonant frequency by at least 400 Hertz.

33. The method as in claim 28 wherein step (c) further comprises the step of offsetting the carrier frequency from the resonant frequency by up to 2000 Hertz.

34. The method as in claim 28 wherein step (c) further comprises the step of offsetting the carrier frequency from the resonant frequency by 400 to 2000 Hertz.

* * * * *